United States Patent
Phillips

(10) Patent No.: US 8,127,876 B2
(45) Date of Patent: Mar. 6, 2012

(54) COOLING ENCLOSURE FOR ELECTRONIC MOTOR CONTROL COMPONENTS

(75) Inventor: David Lawrence Phillips, Willow Springs, NC (US)

(73) Assignee: Deere & Company, Moline, IL (US)

( * ) Notice: Subject to any disclaimer, the term of this patent is extended or adjusted under 35 U.S.C. 154(b) by 1289 days.

(21) Appl. No.: 11/588,666

(22) Filed: Oct. 26, 2006

(65) Prior Publication Data

US 2008/0099262 A1    May 1, 2008

(51) Int. Cl.
*B60K 11/06* (2006.01)
(52) U.S. Cl. .................... 180/68.2; 180/68.5
(58) Field of Classification Search ............... 180/68.1, 180/68.2, 68.5; 165/41, 42, 53
See application file for complete search history.

(56) References Cited

U.S. PATENT DOCUMENTS

| | | | |
|---|---|---|---|
| 4,696,508 A * | 9/1987 | Brautigam ............... 296/65.05 |
| 5,320,190 A * | 6/1994 | Naumann et al. ........... 180/68.2 |
| 5,392,873 A * | 2/1995 | Masuyama et al. .......... 180/68.5 |
| 5,660,244 A * | 8/1997 | Matsuda .................... 180/68.1 |
| 5,794,422 A | 8/1998 | Reimers et al. |
| 6,029,762 A * | 2/2000 | Kepner ..................... 180/65.1 |
| 6,082,084 A | 7/2000 | Reimers et al. |
| 6,377,462 B1 | 4/2002 | Hajicek et al. |
| 6,449,934 B1 | 9/2002 | Reimers et al. |
| 6,547,020 B2 * | 4/2003 | Maus et al. ................ 180/68.5 |
| 6,571,542 B1 * | 6/2003 | Fillman et al. ............... 56/10.6 |
| 6,664,751 B1 | 12/2003 | Gabriel et al. |
| 6,705,065 B2 | 3/2004 | Saiia |
| 7,230,404 B2 * | 6/2007 | Kimoto et al. ............... 320/150 |
| 7,396,075 B2 * | 7/2008 | Ohkuma et al. ............ 297/180.1 |
| 2003/0037525 A1 | 2/2003 | Iida et al. |

\* cited by examiner

*Primary Examiner* — John Walters

(57) ABSTRACT

A cooling enclosure is mounted to the frame of a grass mowing machine adjacent the engine cooling fan of an internal combustion engine. The engine cooling fan draws ambient air across the controllers and batteries in the cooling enclosure. The cooling enclosure includes a one piece molded plastic structure that holds and supports batteries and electronic controllers at positions spaced from its bottom surfaces. One or more removable or hinged panels cover the top of the structure.

11 Claims, 3 Drawing Sheets

COOLING ENCLOSURE FOR ELECTRONIC MOTOR CONTROL COMPONENTS

FIELD OF THE INVENTION

This invention relates generally to hybrid utility vehicles, and particularly to cooling electronic motor control components on grass mowing machines.

BACKGROUND OF THE INVENTION

Hybrid utility vehicles such as grass mowing machines have electric motor and attendant control devices. For example, grass mowing machines may have several controllers. Variable speed and direction are required features of electric motors used in these machines, and the controllers used to achieve these features typically generate substantial heat. The heat must be dissipated to prevent damage to the controller and its components. For example, the heat may be dissipated by providing cooling fins, or heat sinks, on the controller packages. See, for example, U.S. Pat. No. 6,377,462, which is an example of a heat sink for an electronic controller. Cooling fins or heat sinks dissipate heat by allowing ambient air to pass over the fins as the vehicle moves around.

However, heat sinks and cooling fins have several disadvantages. For example, if the vehicle is moving slowly, or not at all, there is little air flow across the fins. Also, since the fins must have access to ambient air, the controllers are typically mounted in an exposed location. These electronic devices are susceptible to failure caused by moisture incursion, and so must be adequately sealed to block the moisture. Additionally, sealing the controllers is more difficult because the machines are normally washed thoroughly after each use by high pressure or low pressure, high volume water streams.

Hybrid grass mowing machines also may have several batteries used to store power. Batteries may have internal heat buildup, and can be subject to unacceptable discharge rates due to internal heat buildup. As a result, battery temperatures must be controlled.

It would be desirable to dissipate heat to prevent damage to electronic controllers and batteries in grass mowing machines. It would be desirable to provide sufficient cooling of electronic controllers and batteries without exposing those components to moisture incursion. It would be desirable to provide sufficient cooling of electronic controllers and batteries even if the grass mowing machine remains stationary. It would be desirable to mount the controllers and batteries in easily accessible locations.

SUMMARY OF THE INVENTION

A cooling enclosure is mounted to the frame of a grass mowing machine adjacent the engine cooling fan of an internal combustion engine. The engine cooling fan draws ambient air across the controllers and batteries in the cooling enclosure. The cooling enclosure includes a one piece molded plastic structure holding and supporting a plurality of batteries and electronic controllers. A hinged panel is attached to the structure. An air inlet and air outlet in the one piece molded plastic structure provide a flow path for ambient air through the cooling enclosure under and around the batteries and electronic controllers. The cooling enclosure holds and supports the batteries and controllers above the bottom surface.

DESCRIPTION OF THE PREFERRED EMBODIMENT

Figure 1:
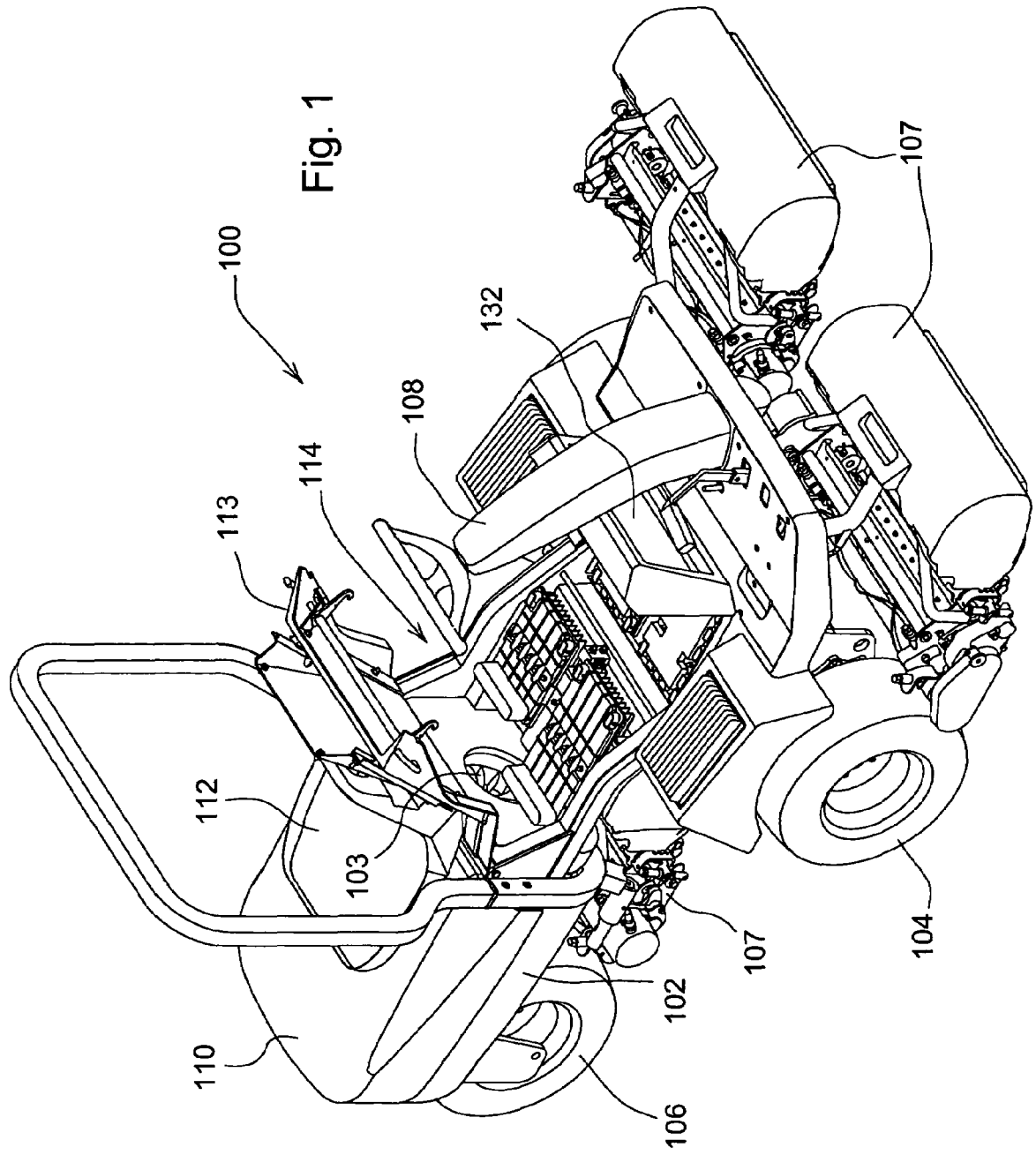
FIG. 1 is a perspective view of a grass mowing machine having a cooling enclosure adjacent the engine cooling fan according to a first embodiment of the invention.

In the embodiment of FIG. 1, grass mowing machine 100 may be a hybrid greens mower having a frame 102, a pair of front ground engaging wheels 104, and a single steerable rear wheel 106. The grass mowing machine may have three reel-type cutting units 107. Alternatively, it may have more than three cutting units, and rotary or reel-type cutting units. Steering column 108 may be mounted to the mower adjacent the front end of the frame. Engine compartment 110 housing an internal combustion engine may be mounted to the mower at the rear of the frame. The internal combustion engine has a cooling fan 103 at its forward end. Operator's seat 112 may be in front of the engine compartment, and may be mounted on a panel 113. Panel 113 may be hinged or removably attached to the frame so that access is easily provided to components in cooling enclosure 114 located under and/or in front of the operator's seat.

In one embodiment, cooling enclosure 114 has an air outlet opening 124 adjacent engine cooling fan 103. As engine fan 103 spins, it draws ambient air through air outlet opening 124, across batteries 119 and controllers 120, 121 in the cooling enclosure. Air outlet opening 124 may in the rear wall 117 of cooling enclosure. Optionally, gas tank 134 may be located behind rear wall 117 and may have an opening corresponding to air outlet opening 124, through which ambient air may be drawn by the engine cooling fan.

Figure 2:
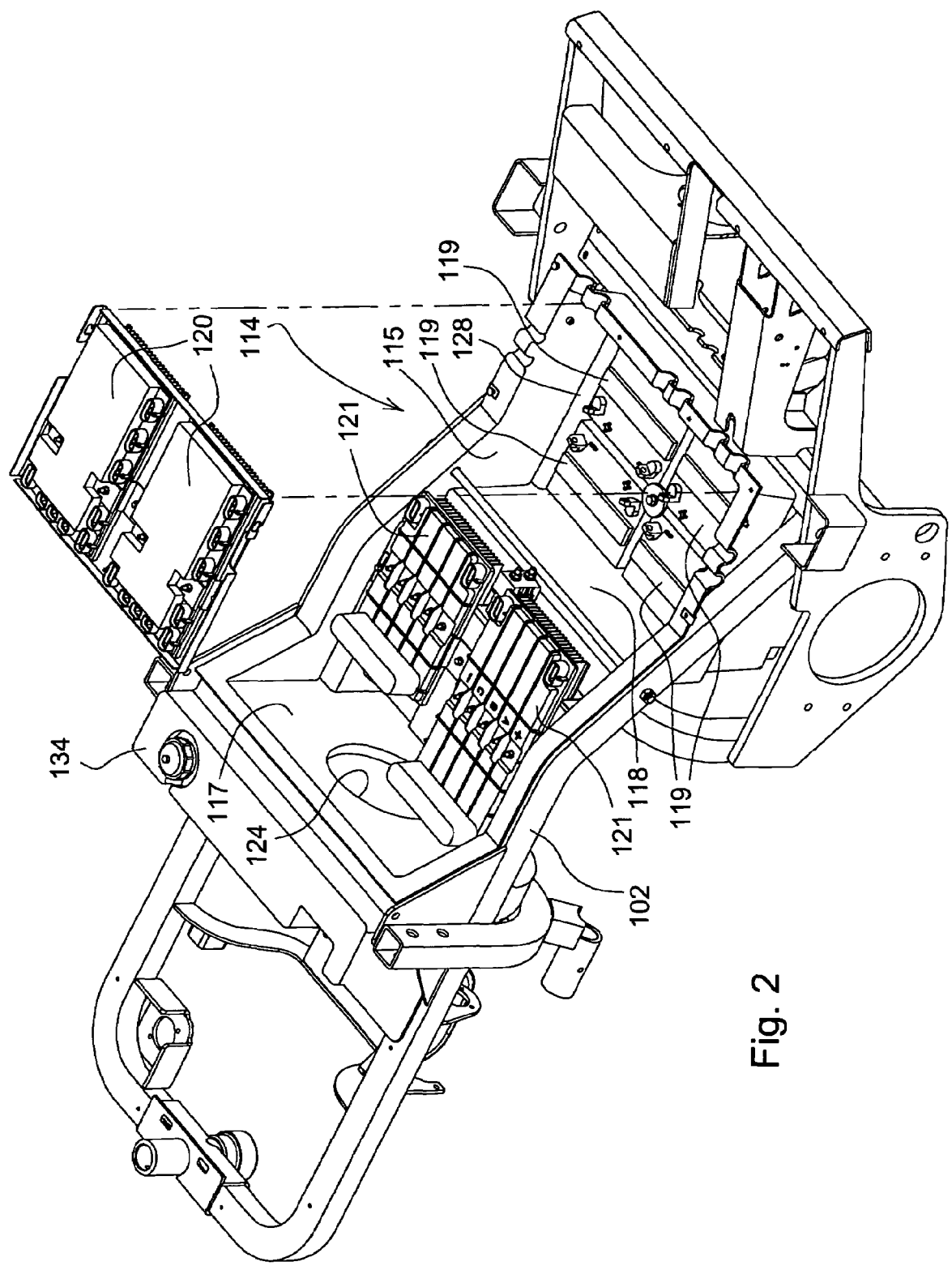
FIG. 2 is a perspective view of a cooling enclosure for electric motor control components mounted in the frame of a grass mowing machine according to a first embodiment.
Figure 3:
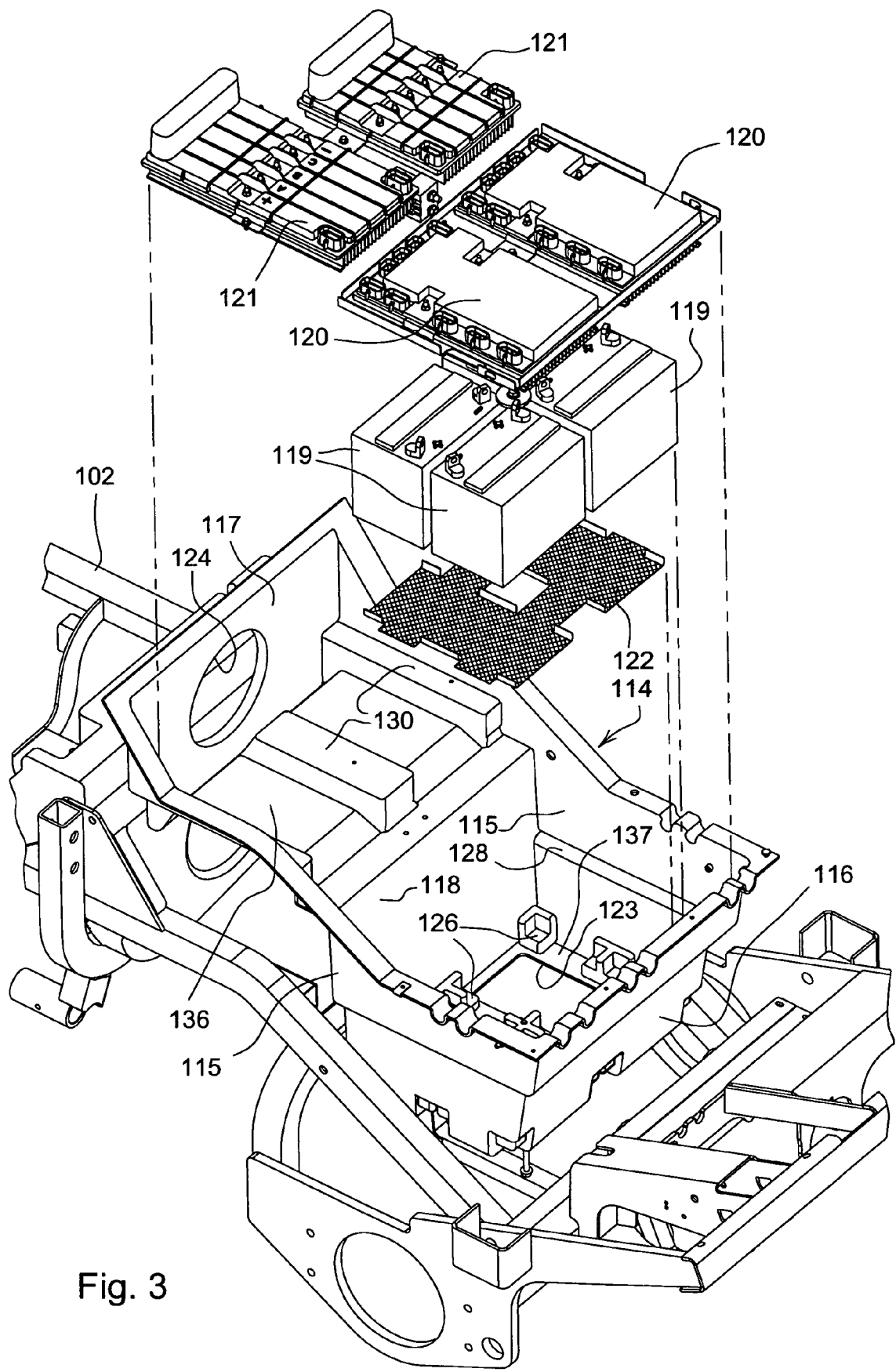
FIG. 3 an exploded perspective view of a cooling enclosure for electric motor control components according to a first embodiment of the invention.

In one embodiment, as shown in FIGS. 2 and 3, cooling enclosure 114 has an air inlet opening 123 to allow ambient air to enter the cooling enclosure, but limit moisture penetration. The air inlet opening may be covered by screen 122 and may be baffled to allow ambient air to enter the cooling enclosure, but limit particle and moisture penetration.

In one embodiment, cooling enclosure 114 may be a one piece molded structure, made from plastic or other durable material. The cooling enclosure may be mounted to frame 102 with air outlet opening 124 adjacent engine cooling fan 103. The cooling enclosure is dimensioned to hold and support two or more batteries 119 and electronic controllers 120, 121. The cooling enclosure may have upper and lower bottom surfaces 136, 137, a pair of side walls 115, a front wall 116, a rear wall 117, and an intermediate wall 118 between the upper and lower bottom surfaces. The cooling enclosure may surround the bottom and sides of batteries 119 and controllers 120, 121.

Additionally, as shown in FIG. 1, cooling enclosure 114 may have one or more movable panels 113, 132 over the batteries and controllers. For example, panel 113 may be under the operator's seat and may be hinged to pivot rearwardly, or otherwise easily removed from the cooling enclosure. Panel 132 may pivot toward the front of the mowing machine. Each panel may cover part of the top of the cooling enclosure, and may provide service access to the batteries and controllers when the panel is opened.

In one embodiment, batteries 119 may be mounted in position spaced from the lower bottom surface 137 of the cooling enclosure, preferably on mounting supports 126 that are molded into the cooling enclosure. Mounting the batteries above the bottom surface 137 provides a flow path for ambient air drawn by engine cooling fan 103 to enter through the air inlet opening into cooling enclosure 114, under and around the side surfaces of the batteries. Additionally, controllers 120 may be mounted above batteries 119 on supports 128 that are molded as part of the cooling enclosure, providing a flow path for ambient air between batteries 119 and controllers 120, and under and around the sides of the controllers. Controllers 121 may be mounted on supports 130 that also may be molded as part of the cooling enclosure, supporting the controllers at position spaced from the upper bottom surface 136, to provide a flow path for ambient air under and around the controllers. Ambient airflow drawn by engine cooling fan 103 may exit the cooling enclosure through air outlet opening 124.

In one embodiment, cooling enclosure 114 provides for predictable continuous cooling of batteries and controllers in a hybrid grass mowing machine while the engine cooling fan is running. The cooling enclosure also substantially reduces moisture access to the electric or electronic components. Additionally, the cooling enclosure provides good access to those components for servicing. The cooling enclosure utilizes the internal combustion engine fan to provide ambient air flow without additional cooling apparatus.

Having described the preferred embodiment, it will become apparent that various modifications can be made without departing from the scope of the invention as defined in the accompanying claims.

The invention claimed is:

1. A cooling enclosure mounted to the frame of a grass mowing machine having an internal combustion engine and an engine cooling fan, comprising:
   a one piece structure having an air outlet opening adjacent the engine cooling fan and a screened air inlet opening in a bottom surface thereof, the structure holding and supporting a plurality of batteries and electronic controllers; and
   a removable panel covering at least a portion of the one piece structure;
   a plurality of mounting supports molded into the cooling enclosure on which the controllers and the batteries are mounted spaced above the bottom surface to provide a flow path for ambient air between the batteries and the controllers under and around the controllers while the removable panel covers the structure.

2. The cooling enclosure of claim 1 further comprising an operator seat on a removable panel covering at least a portion of the one piece structure.

3. The cooling enclosure of claim 1 wherein the mounting supports are molded into the structure holding the controllers at positions spaced from the batteries.

4. The cooling enclosure of claim 1 wherein the removable panel is hinged.

5. A cooling enclosure mounted to the frame of a grass mowing machine adjacent an engine cooling fan of an internal combustion engine, comprising:
   a one piece molded plastic structure holding and supporting a plurality of batteries and electronic controllers in spaced relation and having an openable and closeable panel; and
   an air inlet and an air outlet in the one piece molded plastic structure and providing flow paths for ambient air through the cooling enclosure under and around the sides of the batteries and electronic controllers while the panel is closed; the air outlet positioned adjacent the engine cooling fan; and
   a screen on the air inlet underneath the batteries.

6. The cooling enclosure of claim 5 wherein the one piece molded plastic structure includes mounting supports holding and supporting the batteries above the bottom surface.

7. The cooling enclosure of claim 5 wherein the one piece molded plastic structure is positioned at least partially under an operator's seat of the grass mowing machine.

8. A cooling enclosure mounted to the frame of a grass mowing machine adjacent an engine cooling fan of an internal combustion engine, comprising:
   a molded plastic structure having a bottom surface and supports molded therein to support at least two batteries and at least two controllers in spaced relation to provide a flow path for ambient air under and between the batteries and the controllers;
   an air inlet through a screened bottom surface under the supports for ambient air to flow into the molded plastic structure under the batteries; and
   an air outlet above the controllers for ambient air drawn by the engine cooling fan to be drawn out from the molded plastic structure.

9. The cooling enclosure of claim 8 further comprising a panel hinged over the molded plastic structure.

10. The cooling enclosure of claim 8 further comprising upper and lower bottom surfaces, and supports molded into the upper and lower bottom surfaces.

11. The cooling enclosure of claim 10 wherein at least one of the controllers is supported and held above each of the upper and lower bottom surfaces.

\* \* \* \* \*